United States Patent [19]

Inoue

[11] Patent Number: 5,182,233
[45] Date of Patent: Jan. 26, 1993

[54] COMPOUND SEMICONDUCTOR PELLET, AND METHOD FOR DICING COMPOUND SEMICONDUCTOR WAFER

[75] Inventor: Kazuhiko Inoue, Yokohama, Japan

[73] Assignee: Kabushiki Kaisha Toshiba, Kawasaki, Japan

[21] Appl. No.: 771,850

[22] Filed: Oct. 7, 1991

Related U.S. Application Data

[62] Division of Ser. No. 557,782, Jul. 26, 1990, abandoned.

[30] Foreign Application Priority Data

Aug. 2, 1989 [JP] Japan ................... 1-200773

[51] Int. Cl.$^5$ ........................................ H01L 21/302
[52] U.S. Cl. ............................ 437/226; 148/DIG. 28; 257/620; 257/627
[58] Field of Search ............... 357/60, 55; 437/226; 148/DIG. 28

[56] References Cited

U.S. PATENT DOCUMENTS

| | | | |
|---|---|---|---|
| H291 | 6/1987 | Boos ..................................... | 357/22 |
| 3,877,705 | 4/1975 | Joschko et al. ..................... | 125/30.01 |
| 3,927,385 | 12/1975 | Pratt, Jr. .............................. | 372/44 |
| 4,500,388 | 2/1985 | Ohmura et al. ..................... | 357/60 |
| 4,630,093 | 12/1986 | Yamaguchi et al. ................ | 357/55 |
| 4,784,722 | 11/1988 | Liau et al. ............................ | 437/129 |
| 4,792,962 | 12/1988 | Miyauchi et al. ................... | 372/45 |
| 4,823,022 | 4/1989 | Kosugi ................................. | 258/492.2 |
| 4,993,266 | 2/1991 | Omura et al. ....................... | 73/720 |

FOREIGN PATENT DOCUMENTS

| | | | |
|---|---|---|---|
| 0354449 | 2/1990 | European Pat. Off. ............ | 357/60 |
| 61-059854 | 3/1986 | Japan ................................... | 437/226 |
| 63-077132 | 4/1988 | Japan ................................... | 437/226 |
| 2-192753 | 7/1990 | Japan ................................... | 437/226 |
| 3-065599 | 3/1991 | Japan . | |
| 3-218050 | 9/1991 | Japan . | |

OTHER PUBLICATIONS

S. K. Ghandhi, *VLSI Fabrication Principles*, John Wiley & Sons, New York; 1983, pp. 12–14.

Won-Tien Tsang et al., "Profile and groove-depth control in GaAs diffraction gratings fabricated by preferential chemical etching in $H_2SO_4-H_2O_2-H_2O$ system", *Applied Physic Letter*, vol. 28 (Jan. 1976) pp. 44–46.

R. C. Ghee et al., "Polycrystallinity of (100) oneated Crystals", *IBM Technical Disclosure Bulletin*, vol. 14 (Jun. 1971) p. 186.

*Primary Examiner*—Brian E. Hearn
*Assistant Examiner*—Laura M. Holtzman
*Attorney, Agent, or Firm*—Finnegan, Henderson, Farabow, Garrett and Dunner

[57] ABSTRACT

A compound semiconductor pellet has a zincblende crystal structure and is formed of a III-V compound semiconductor, such as GaAs. The major surface of the pellet and side surfaces thereof are both {100} planes. To obtain this type of pellet, [010] and [001] directions are selected as dicing directions. In the case of a crystal having a zincblende crystal structure, a direction which forms 45° with reference to a cleavage plane of the crystal is selected as a dicing direction.

2 Claims, 4 Drawing Sheets

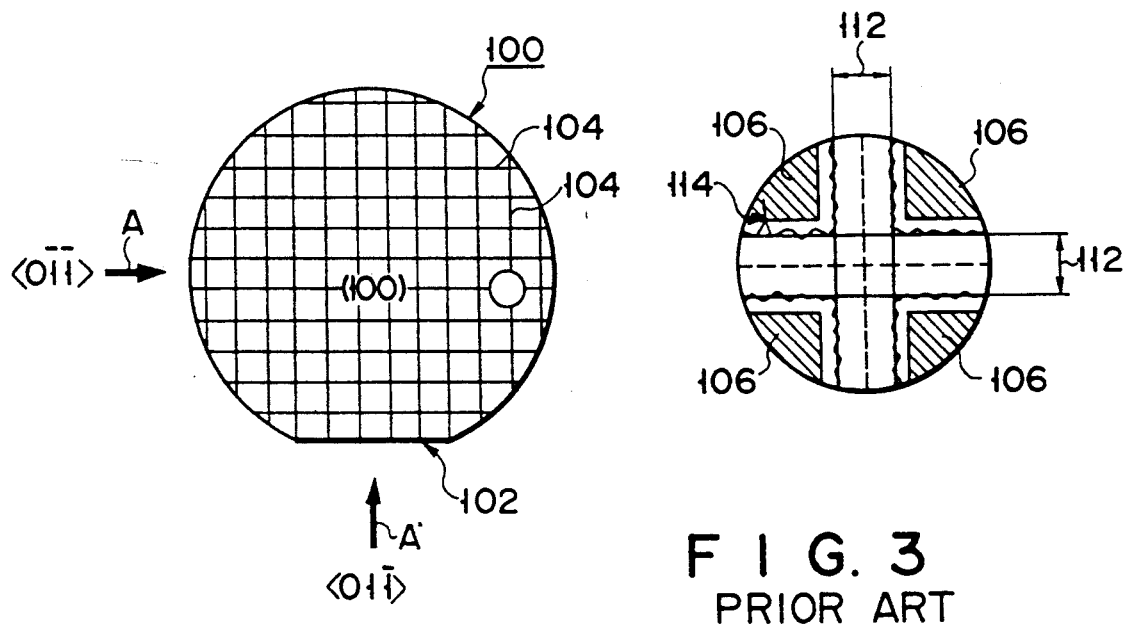
FIG. 3
PRIOR ART
FIG. 1
PRIOR ART
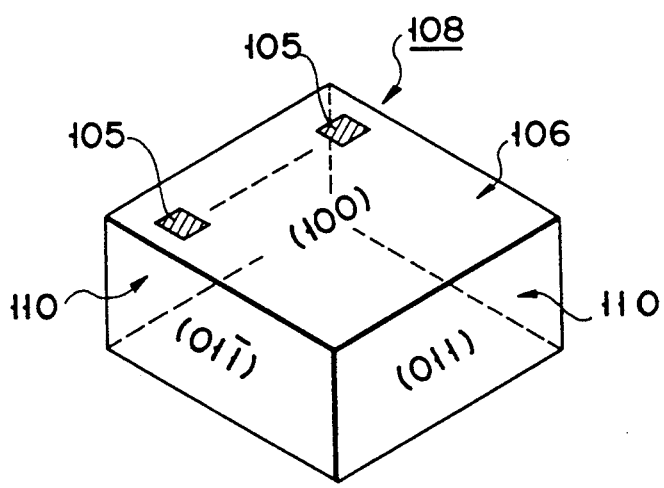
FIG. 2
PRIOR ART

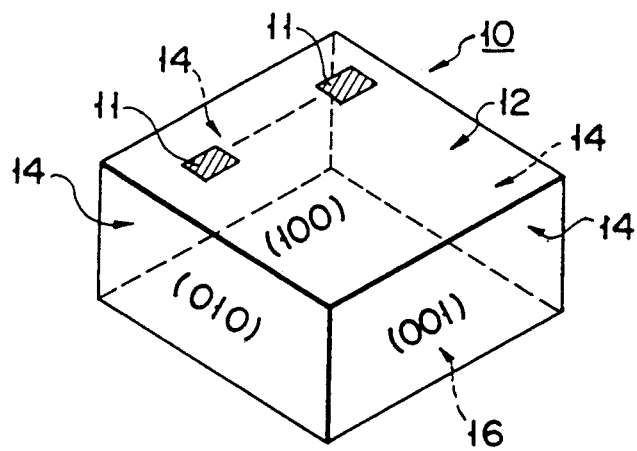
FIG. 4
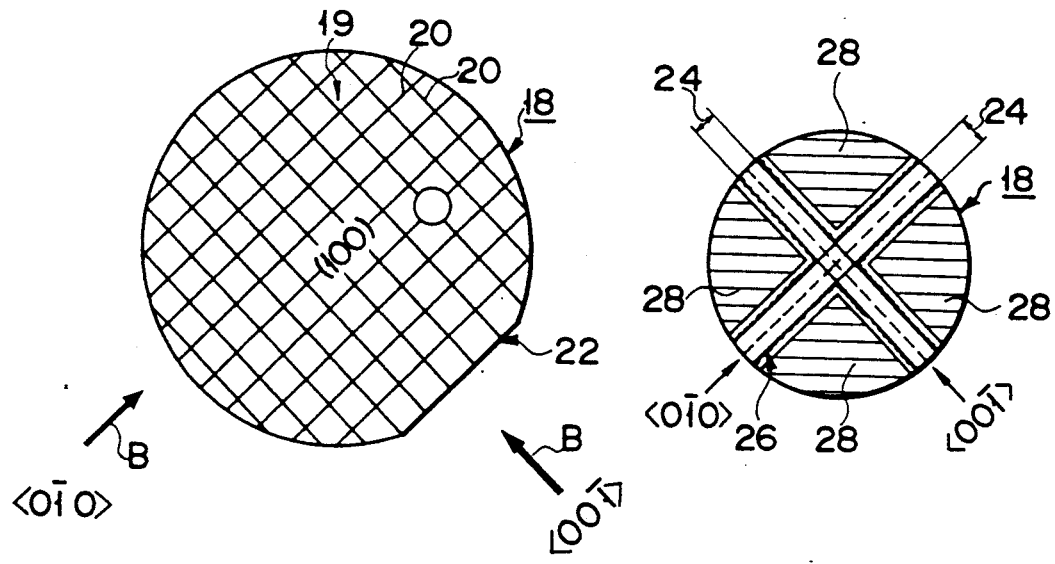
FIG. 5
FIG. 6
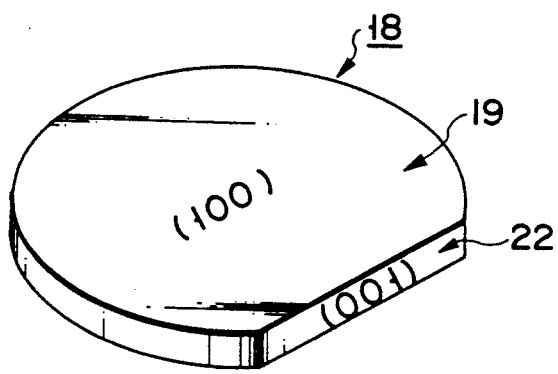
FIG. 7

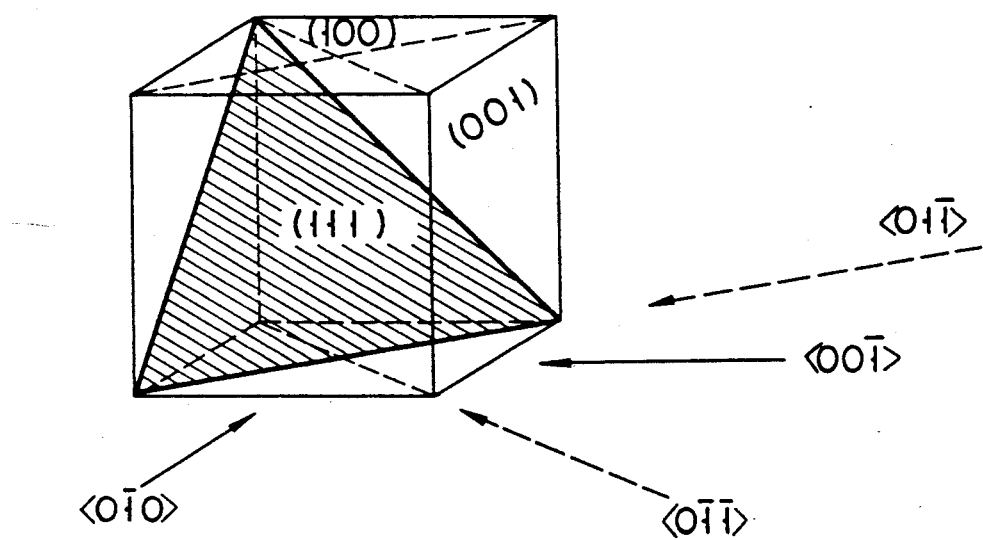
F I G. 11
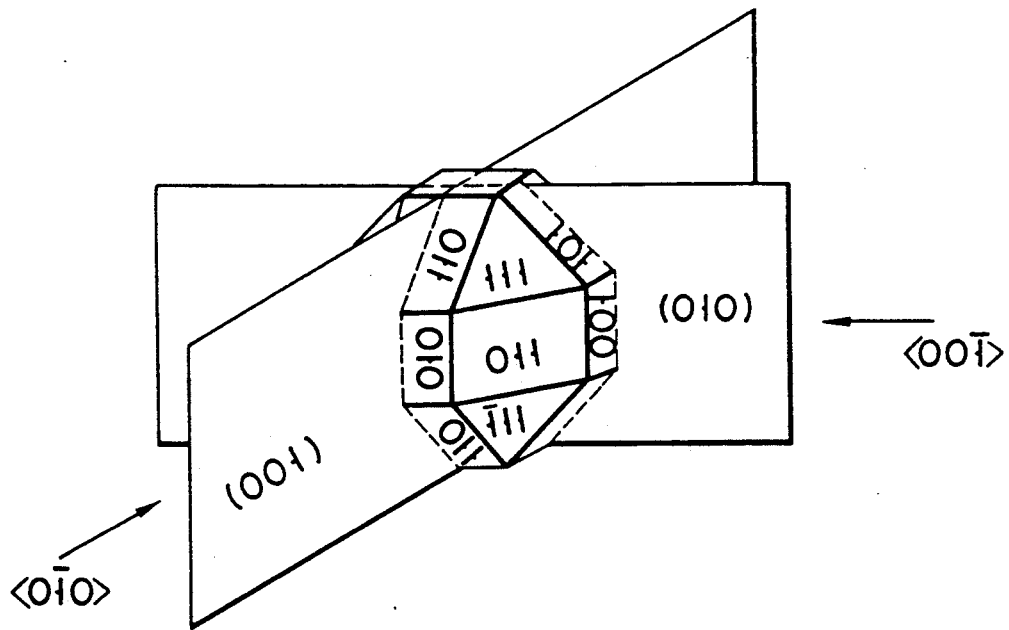
F I G. 12

COMPOUND SEMICONDUCTOR PELLET, AND METHOD FOR DICING COMPOUND SEMICONDUCTOR WAFER

This application is a division of now abandoned application Ser. No. 07/557,782, filed Jul. 26, 1990.

BACKGROUND OF THE INVENTION

1. Field of the Invention

The present invention relates to a compound semiconductor pellet, and also to a method for dicing a compound semiconductor wafer.

2. Description of the Related Art

A compound semiconductor wafer formed of a single crystal is diced along a cleavage plane since along this plane the single crystal easily splits. For example, a GaAs single crystal, one of III-V compound semiconductor, has a cleavage plane expressed as {011}, so that it is diced along the {011} plane in the direction of [011].

In the present specification, the crystal plane and the crystal orientation are expressed on the basis of the Miller indices. In the case where a cubic crystal has identical planes, such as (100), ($\bar{1}$00), (010), (0$\bar{1}$0), (001) and (00$\bar{1}$), these identical planes will be generically represented by a notation using braces, such as {100}. The direction in which a crystal axis extends (i.e., a crystal orientation) will be denoted by a notation using the symbols "<" and ">", and equivalent crystal orientations, such as <001> and <00$\bar{1}$> will be generically represented by a notation using brackets, such as [001].

FIG. 1 is a plan view of a GaAs wafer. This GaAs wafer is a well-known type wherein the major surface on which elements are to be formed is a (100) plane.

A is shown in FIG. 1, the cleavage plane of the GaAs wafer 100 (which is a single crystal) is a {011}. plane, so that the GaAs wafer 100 is diced in the [011]direction, as is indicated by arrow A. Reference numeral 104 in FIG. 1 denotes dicing lines.

The wafer 100 has an orientation flat 102. This orientation flat 102 allows easy recognition of the posture of the wafer 100 in the semiconductor device-manufacturing process, or allows easy recognition of the cleavage plane of the wafer 100. The orientation flat 102 is formed by cutting the wafer 100 along the cleavage plane, i.e., in the [011] direction, such that a [011] plane is exposed.

FIG. 2 is a schematic perspective view of a GaAs pellet obtained by the dicing method mentioned above.

As is shown in FIG. 2, the major surface 106 of the GaAs pellet 108 is a (100) plane, and semiconductor elements 105 are formed on the major surface. The side surfaces 110 of the GaAs pellet 108 are exposed cleavage planes (011), (01$\bar{1}$), (01/ ) and (0$\bar{1}$1), respectively. That is, all side faces 110 of the GaAs pellet 104 are {011} planes if a (100) plane is selected as the major surface of the pellet 104.

The reason for selecting the cleavage plane as a dicing plane is that the semiconductor wafer easily cracks along the cleavage plane if only the groove is formed in the wafer by use of a blade or the like. It should be noted, however, that if the groove is formed in the [011] direction, a large kerf width will be produced at the time of dicing.

FIG. 3 is an enlarged view of the portion circled in FIG. 1 and illustrates details of a dicing line 104 and its neighboring regions.

As is shown in FIG. 3, the kerf width 112 will be large if the groove is formed in the [011] direction. In addition, a coarse surface will be produced at the time of dicing the wafer, as indicated by 114 in FIG. 3. If the surface is greatly roughened, not only the reliability of a semiconductor element formed inside the pellet 106 but also the outward appearance of the pellet 106 is adversely affected. In some cases, the pellet 106 itself may be cut at the time of dicing, resulting in damage to the element formed inside the pellet 106.

In the case of a III-V compound semiconductor single crystal, the atoms join in two ways: covalent bonding which occurs through electron clouds expanding in four directions; and ionic bonding which is based on Coulomb force. The reason that the Coulomb force is generated is that the III-group atoms and the V-group atoms differ in electronegativity. More specifically, the III-group atoms tend to emit three electrons and become a cation having a valence of $+3$, while the V-group atoms tend to receive three electrons and become an anion having a valence of $-3$.

The atoms of a single silicon or germanium crystal join by the covalent bonding alone. In contrast, the atoms of the III-V compound semiconductor single crystal join by both the covalent bonding and ionic bonding, as mentioned above. In connection with the III-V compound semiconductor single crystal, it should be also noted that the force of the ionic bonding is greater than that of the covalent bonding, so that the direction of the interatomic bonding force is determined mainly by the direction of the ionic bonding.

As may be understood from the above, the III-V compound semiconductor single crystal differs from the single silicon or germanium crystal, in light of the easiness of cleavage, the direction of cleavage, etc. The differences will be described in more detail below.

In the base of the III-V compound semiconductor single crystal, a {111} planes is totally occupied with either III-group atoms or V-group atoms. In addition, since the III-group atoms of one {111} plane and the V-group atoms of another 111 plane are very close to each other, the Coulomb force acting between the two {111} planes is so intense as to provide the strongest possible bonding. Unlike the {111} planes, the {011} planes are occupied with III-group atoms and V-group atoms. Since the {011} planes are electrically neutral and the Coulomb force weak, they are used as cleavage planes.

Let it be assumed that the groove is formed in the III-V compound semiconductor single crystal by moving a blade along a {011} plane (i.e., a cleavage plane) in the [011] direction. In this case, the movement of the blade may be affected by a {111} plane (i.e., a plane which provides the strongest possible bonding) since the {111} plane is 45° slanted with reference to the depth direction of the crystal. That is, the blade may slide along the {111} plane when the groove is formed.

In practice, the {111} planes are hard to expose in a satisfactory manner. As is indicated in FIG. 3, there may be a certain kerf width 112, and the exposed surfaces may be coarse.

As long as the groove formed by use of the blade is not deep, the above problems can be solved to a certain extent, even if the blade is slid in the [011] direction. If the groove is formed by use of a diamond scriber, the above problems can be almost solved.

However, if the groove formed by the blade is shallow or if it is formed by use of a diamond scriber, the thickness of that portion of the crystal which should be divided by cracking will increase. As a result, the following problems occur:

(1) It is likely that crack-dust will be produced in large quantities at the time of cracking the GaAs wafer. If crack-dust is produced, it is hard to remove, since the GaAs wafer is a semi-insulating material and is electrified due to the static electricity generated at the time of cracking. If such crackdust is left on the pellet, wire bonding cannot be satisfactorily performed with respect to the pellet. In addition, the reliability of the semiconductor device incorporating the pellet may be adversely affected.

(2) The direction of the dicing line has to be accurately the same as the direction of cleavage. If not, the pellets obtained by dicing the GaAs wafer cannot be easily separated from one another. This means that the wafer has to be set accurately at the right position in the photolithography step of the manufacture of a semiconductor element. If the wafer is not accurately set, the mass production of pellets is adversely affected.

(3) To crack the GaAs wafer, a great load is required, so that the GaAs wafer may be mechanically damaged. If the GaAs wafer is mechanically damaged, a pellet is stressed, resulting in deterioration in the reliability of the pellet.

SUMMARY OF THE INVENTION

Accordingly, the first object of the present invention is to provide a compound semiconductor pellet which can be obtained by dicing a compound semiconductor wafer by use of a dicing blade without causing a large kerf width and without producing greatly roughened surfaces, which can hold an element with minimum characteristic variation, and which is suitable for mass production.

The second object of the present invention is to provide a method which enables a compound semiconductor wafer to be diced without causing a large kerf width and without producing greatly roughened surfaces.

The first object is achieved by a compound semiconductor pellet which comprises: a major surface on which an element is to be formed and is constituted by a {100} plane; and a side surface which is perpendicular to the major surface and which is constituted by a {100} plane.

The second object is achieved by a method for dicing a compound semiconductor wafer, which comprises the steps of: dicing a crystal constituting the wafer in a [001] direction; and dicing the crystal in a [010] direction.

In the compound semiconductor pellet of the above device, the major surface of which the element is formed is constituted by a {100} plane, and a side surface which is perpendicular to the major surface is also constituted by a {100} plane. Since the chipping on the side surface of the pellet is suppressed, the side surface is substantially flat. Accordingly, the element formed on the pellet hardly varies in characteristics.

With the compound semiconductor wafer-dicing method of the present invention, the kerf width is small and the surfaces of a pellet are not much roughened by dicing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view of a conventional wafer;

FIG. 2 is a perspective view of a conventional pellet;

FIG. 3 is an enlarged view of the portion circled in FIG. 1;

FIG. 4 is a perspective view of a pellet according to an embodiment of the present invention;

FIG. 5 is a plan view of a wafer according to an embodiment of the present invention;

FIG. 6 is an enlarged view of the portion circled in FIG. 5;

FIG. 7 is a perspective view of a wafer which is desirable for use in the present invention;

FIG. 11 is a view showing a (111) crystal plane of a cubic lattice; and

FIG. 12 is a view showing the dicing directions used in the embodiment of the present invention, the dicing directions being illustrated, with the twentysix-faced polyhedron shown in FIG. 10 being taken by way of example.

DETAILED DESCRIPTION OF THE PREFERRED EMBODIMENTS

Figure 8:
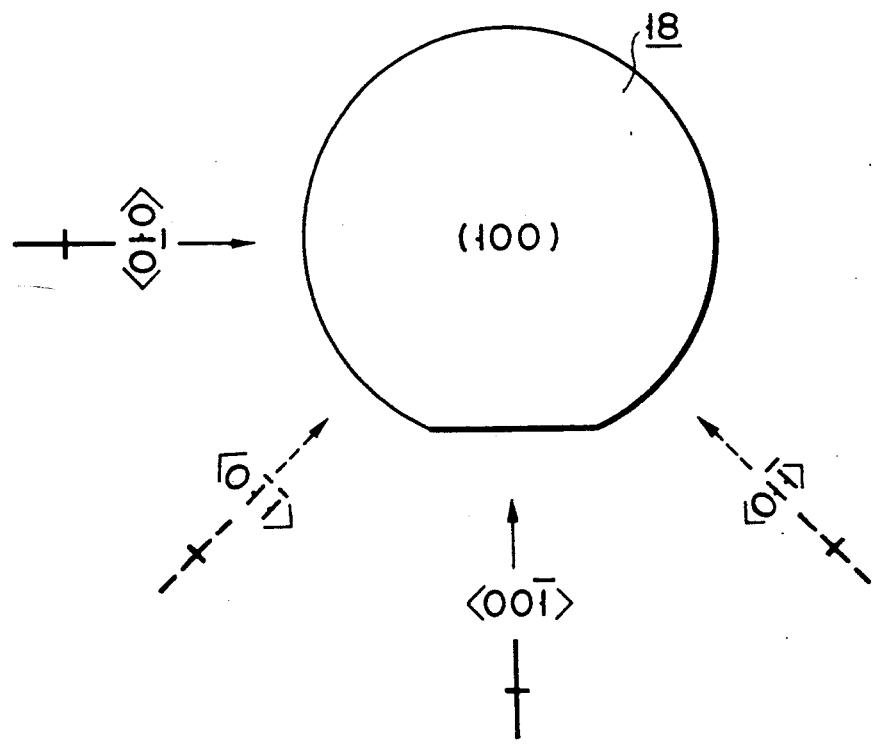
FIG. 8 is a plan view of a wafer showing a dicing direction used in the embodiment of the present invention.

A compound semiconductor pellet according to one embodiment of the present invention and a method for dicing a compound semiconductor wafer to obtain the pellet will now be described, with reference to the accompanying drawings.

FIG. 4 is a schematic perspective view of a GaAs pellet formed of a III-v compound semiconductor. The GaAs pellet is an example of a compound semiconductor pellet according to the embodiment of the present invention.

As is shown in FIG. 4, the GaAs pellet 10 has a major surface 12 on which elements 11 are to be formed. This major surface 12 is a (100) plane. The four side surfaces 14 of the GaAs pellet 10 are (001), (010), (00$\bar{1}$) and (0$\bar{1}$0) planes, respectively. The bottom surface 16 is a ($\bar{1}$00) plane. In short, the GaAs pellet is a hexahedron, all six faces of which are {100} planes.

FIG. 5 is a plan view of a single-crystal GaAs wafer used for obtaining the GaAs pellet 10. This GaAs wafer 18 has a major surface 19 constituted by a (100) plane, and is diced in the [001] and [010] directions by use of a dicing blade. Reference numeral 20 in FIG. 5 denotes dicing lines.

To allow easy recognition of the posture of the wafer 18 in the semiconductor device-manufacturing process, an orientation flat 22 is provided for the wafer 18. The orientation flat 22 is formed by cutting the wafer 18 in the [010] direction such that a {100} plane is exposed.

FIG. 6 is an enlarged view of the portion circled in FIG. 5 and illustrates details of one dicing line 20 along with its neighboring regions.

According to the present invention, the groove is formed in the GaAs wafer 18 in the [001] and [010] directions. Since the groove is formed in this way, the kerf width 24 is smaller than that of the prior art, as is shown in FIG. 6. In addition, the surfaces of the resultant pellet are prevented from becoming rough after the dicing operation, as is indicated by "26".

More specifically, in the case where a blade having a thickness of 15 μm was used, the kerf width was about 30 μm m in the prior art, but was about 20 μm in the present invention. The roughened portions which are caused on one side of a pellet as a result of chipping had a size of about 20–30 μm in the case of the prior art, but had a size of about 10 μm or less in the case of the present invention.

As may be understood, the dicing lines of the present invention are narrower than those of the prior art. Thus, a larger number of GaAs pellets can be obtained from one GaAs wafer. It should be also noted that an element region 28 of the pellet is prevented from being damaged by the dicing operation.

The side faces of the pellet of the present invention are not much roughened as a result of the dicing operation. Therefore, the pellet can hold elements which have minimum characteristic variation and is highly reliable in performance. Moreover, since a large number of GaAs pellets can be obtained from one GaAs wafer, the GaAs pellets are suitable for mass production.

FIG. 7 is a perspective view of a GaAs wafer which is suitable for use in the manufacture of the GaAs pellet of the embodiment of the present invention.

As is shown in FIG. 7, the major surface 19 of the GaAs wafer 18 is a (100) plane, and the exposed surface constituting the orientation flat 22 is a (001) plane, i.e., a {100} plane. In the case of this type of wafer, the [001] and [010] directions can be easily selected as the direction of the dicing line by using a known program incorporated in a blade dicer control machine.

The method which the present invention provides for manufacturing the GaAs pellet will be described in more detail.

First of all, a GaAs wafer, such as that shown in FIG. 7, is prepared. Dicing lines, along which the GaAs wafer is divided into pellets, are provided on the GaAs wafer in the manner shown in FIG. 5. The width of the dicing lines is about 60 μm.

The mask of the photolithography used for the manufacture of the semiconductor device has a pattern which is designed such that the dicing lines extend in the [001] and [010] directions and have a width of about 60 μm. It should be noted that the dicing lines used in the prior art have a width of about 90 μm.

Desirable active elements are formed on the GaAs wafer. Alternatively, an integrated circuit including desirable active and passive elements is formed on the GaAs wafer. After the formation of the elements or integrated circuit, the reverse-side of the GaAs wafer is lapped until the GaAs wafer has a predetermined thickness.

Then, a mounting material is coated on the reverse-side of the GaAs wafer. For example, AuGe is deposited on the reverse-side as the mounting material. Thereafter, a dicing sheet is pasted on the reverse-side, and the GaAs wafer is diced along the dicing lines by use of a well-known blade dicer. By this dicing, the GaAs wafer is divided into a plurality of pellets.

In the dicing operation, it is not absolutely necessary to completely divide the GaAs wafer into pellets. The dicing operation may be stopped when the pellets to be obtained are still connected. In this case, the pellets are separated from one another by cracking afterward.

After dicing the GaAs wafer, the dicing sheet is heated and pulled in one direction by use of a suitable jig, so as to separate the dicing sheet from the GaAs pellets. As a result, the GaAs pellets, one of which looks as depicted in FIG. 4, are obtained. The GaAs pellets, thus obtained, are conveyed to a predetermined position to carry out an assembling step.

The theory underlying the present invention will now be described from the stage of a wafer to that of a crystal, with reference to FIGS. 8 to 12.

Figure 9:
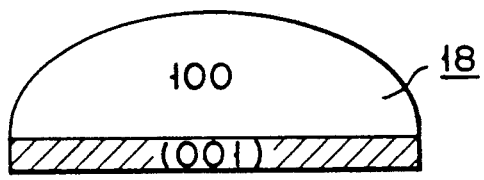
FIG. 9 is a partially-sectional perspective view of a wafer according to the embodiment of the present invention.

FIG. 8 is a plan view of a GaAs wafer, and FIG. 9 is a partially-sectional perspective view of the GaAs wafer. To compare the present invention with the prior art, the dicing direction utilized in the present invention and the dicing direction utilized in the prior art are both indicated in FIG. 8.

As is shown in FIG. 8, the GaAs wafer 18, the major surface of which is a (100) plane, is diced in the [010] and [001] directions according to the present invention. According to the prior art, in contrast, the GaAs wafer 18 is diced in the [011] direction.

As is shown in FIG. 9, a (010) plane, i.e., a {100} plane, is exposed in the case where the GaAs wafer 18 is diced in the [010] direction, as in the present invention. Although not shown, a {011} plane, i.e., a cleavage plane, is exposed in the case where the GaAs wafer 18 is diced in the [011] direction.

Figure 10:
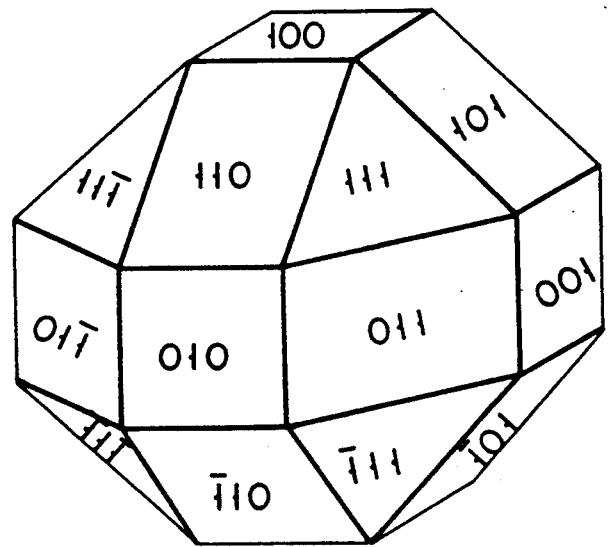
FIG. 10 is a perspective view of a twenty-six-faced polyhedron wherein all crystal planes of a cubic lattice can be expressed.

FIG. 10 is a perspective view of a twenty-six-faced polyhedron which is classified as a cubic lattice type crystal and all faces of which can be identified on the basis of the Miller indices. Of all faces of the polyhedron, those which can be illustrated in FIG. 10 are shown with their crystal plane indices.

FIG. 11 is a view showing how a (111) crystal plane exists in the cubic lattice. The (111) crystal plane is shown together with the related crystal orientations.

As is seen from FIG. 11, each of the [010] and [001] directions, which are the dicing directions used in the present invention, forms an angle of 45° with reference to the (111) plane. According to the present invention, therefore, the GaAs wafer is diced in the directions which form 45° with reference to the (111) plane.

If the [011] direction is used as a dicing direction, as in the prior art, the GaAs wafer is diced in the direction which forms right angles with reference to the (111) plane. Since, in this case, a cleavage plane is exposed by the dicing, the wafer can be easily cleaved. It should be noted, however, that the dicing along the [011] direction is markedly affected by the {111} plane and is not therefore easy in practice. That is, the rotating blade of the dicer is prevented from being smoothly advanced into the GaAs wafer, due to the existence of the (111) plane, as will be described below.

Let it be assumed that the GaAs wafer is diced by moving the rotating blade in the $<01\bar{1}>$ direction shown in FIG. 11. In this case, a point on the circumference of the blade is advanced into the crystal in the $<01\bar{1}>$ direction while moving circularly. A certain time after the blade enters the interior of the crystal, the point in question comes to the location at which the {111} plane exists in a 45° slanted state. The point in question slips sideways along the {111} plane more or less when it passes through the {111} plane, and is then advanced further into the crystal.

As may be understood from the above, the dicing along the {011} plane results in a large kerf width and leaves markedly-roughened surfaces.

However, in the case where the [010] and [001] directions are selected as dicing directions, as in the present invention, the GaAs wafer is diced in the direction which forms 45° with reference to the {111} plane. Thus, the effects which the {111} plane may have on the movement of the rotating blade can be considerably suppressed. Accordingly, the kerf width is prevented from becoming wide, and chipping can be effected without leaving markedly-roughened surface.

FIG. 12 shows how the twenty-six-faced polyhedron illustrated in FIG. 10 is diced in the present invention. In FIG. 12, the dicing directions are indicated, together with the planes to be exposed and the Miller indices for identifying the types of the planes. As is seen from FIG. 12, the [001] and [010] directions, which are the dicing directions used in the present invention, form 45° with reference to the {011} plane (i.e., a cleavage plane).

According to the dicing method of the present invention, it is easy to completely cut the GaAs wafer into pellets, as will be described below.

In the prior art, a cleavage plane of the GaAs wafer is exposed by partly dicing the GaAs wafer, and then the GaAs wafer is cleaved along the cleavage plane, to thereby obtain GaAs pellets. In other words, the method for obtaining the GaAs pellets involves two steps, namely dicing and cleaving steps, so that it is complicated, accordingly.

If, in the prior art, it is intended that the GaAs pellets be obtained by executing only the dicing step, then the kerf width is inevitably large and the exposed surfaces are inevitably roughened, thus degrading the manufacturing yield of the pellets. These problems may be solved by widening the dicing lines. If this is done, however, a large amount of wafer portion will be used in vain. In other words, the number of pellets which can be obtained from one wafer will decrease.

According to the present invention, the kerf width can be very small and the surfaces to be exposed are prevented from becoming rough as a result of dicing. Thus, the dicing lines used in the present invention can be far narrower than those used in the prior art. Accordingly, it is possible to make the most use of a GaAs wafer when obtaining pellets from it.

As mentioned in the preceding paragraph, according to the present invention, the number of pellets obtained from one wafer can be increased by narrowing the dicing lines. This advantage becomes more important if the number of dicing lines provided on one wafer is increased in accordance with the recent demand for producing smaller-size pellets.

Incidentally, the problems (1) to (3) explained in the "Background of the Invention" can be solved in the present invention if the GaAs wafer is completely divided into pellets by performing the dicing operation in the manner mentioned above.

In the above descriptions, a GaAs crystal was referred to as an example of a crystal to which the present invention was applicable. However, since other III-V compound semiconductors, such as InP, also have a similar zincblende crystal structure to that of the GaAs crystal, the same advantages as mentioned above are obtained even in the case where the III-V compound semiconductors other than GaAs are used. That is, the "GaAs wafer" in the foregoing descriptions should be interpreted as referring to any III-V compound semiconductor wafer having a similar zincblende crystal structure to that of the GaAs wafer.

It should be also noted that the method of the present invention is not only applicable to wafers. It can be applied to any object as long as this object has a zincblende crystal structure.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method for dicing a compound semiconductor wafer, comprising the steps of:
   a) providing a single-crystal III-V compound semiconductor wafer having first dicing lines positioned a distance apart in a [001] direction, second dicing lines positioned a distance apart in a [010] direction, and an orientation flat with a {100} exposed surface;
   b) dicing said semiconductor wafer along said first dicing lines in the [001] direction by use of a blade dicer; and
   c) dicing said compound semiconductor wafer along said second dicing lines in the [010] direction by use of a blade dicer.

2. The method according to claim 1, wherein said single-crystal III-V compound semiconductor wafer is GaAs.

* * * * *